United States Patent [19]

Frederick

[11] Patent Number: 5,309,104

[45] Date of Patent: May 3, 1994

[54] ASYMMETRIC RADIO FREQUENCY COIL FOR MAGNETIC RESONANCE IMAGING

[75] Inventor: Perry S. Frederick, Waukesha, Wis.

[73] Assignee: General Electric Company, Milwaukee, Wis.

[21] Appl. No.: 887,634

[22] Filed: May 22, 1992

[51] Int. Cl.[5] ............................................. G01R 33/20
[52] U.S. Cl. .................................................... 324/318
[58] Field of Search ............... 324/300, 307, 309, 318, 324/322, 312; 128/653.2, 653.5; 333/219; 335/299

[56] References Cited

U.S. PATENT DOCUMENTS

| | | | |
|---|---|---|---|
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,737,718 | 4/1988 | Kemner et al. | 324/322 |
| 4,817,612 | 4/1989 | Akins et al. | 128/653 |
| 4,952,877 | 8/1990 | Stormont et al. | 324/312 |
| 4,992,736 | 2/1991 | Stormont et al. | 324/309 |
| 5,144,240 | 9/1992 | Mehdizadeh et al. | 324/318 |
| 5,196,797 | 3/1993 | Tropp | 324/318 |
| 5,216,368 | 6/1993 | Leussier | 324/318 |

FOREIGN PATENT DOCUMENTS 0336728 11/1989 European Pat. Off. .
0367327 5/1990 European Pat. Off. .
0546622 6/1993 European Pat. Off. .

OTHER PUBLICATIONS

Paper entitled "Experimental Design and Fabrication of Birdcage Resonators for Magnetic Resonance Imaging" Thomas Vullo et al., 8306 Magnetic Resonance in Medicine 24 (1992) Apr., No. 2, Duluth, Minn. U.S. Apr. 1992.

Primary Examiner—Michael J. Tokar
Attorney, Agent, or Firm—Quarles & Brady

[57] ABSTRACT

An NMR excitation coil includes a plurality of conductive elements having varying lengths and arranged parallel to one another to define cylindrical volume. A planar loop connects one end of the conductive element together with the conductive segments between pairs of the conductive elements. A non-planar loop connects the other ends of the conductive elements with a series of conductive segments between pairs of the conductive elements. Some of the non-planar loop segments are formed by a coaxial cable having a central conductor connected between ends of two conductive elements and a shield the electrically floats. A separate capacitor is located in those segments of the two loops that are not formed by coaxial cables. Each capacitor has a capacitance which is defined by the inductance of the conductive elements connected to that capacitor.

9 Claims, 2 Drawing Sheets

ASYMMETRIC RADIO FREQUENCY COIL FOR MAGNETIC RESONANCE IMAGING

BACKGROUND OF THE INVENTION

The field of the invention is nuclear magnetic resonance imaging systems; and more particularly, to coils employed in such systems to excite the nuclei and receive electrical signals produced by the nuclei.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$). the individual magnetic moments of the spins in the tissue attempt to align with this polarizing field, but precess about it in random order at their characteristic Larmor frequency. A net magnetic moment $M_z$ is produced in the direction of the polarizing field, but randomly oriented magnetic components in the perpendicular, or transverse, plane (X-Y plane) cancel one another. If the substance or tissue is subjected to a magnetic field (excitation field $B_1$) which is in the X-Y plane and which is near the Larmor frequency, the net aligned moment ($M_z$) may be rotated, or "tipped", into the X-Y plane to produce a net transverse magnetic moment $M_t$, which is rotating, or spinning, in the X-Y plane at the Larmor frequency. The practical value of this phenomenon resides in the electrical signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective X, Y and Z axes. The field gradients are produced by a trio of coils placed around the object being imaged. By controlling the strength of these gradients during each NMR cycle, the spatial distribution of spin excitation can be controlled and the location of the resulting NMR signals can be identified.

The excitation magnetic field near the Larmor frequency is produced by a separate coil placed adjacent the area of interest in the object being imaged. If an image of substantially the entire object is desired a large coil, often referred to as a "body coil" and extending around the entire object, is used to excite the spinning nuclei and receive the resultant electrical signals. In other situations when only a small portion of the object (such as the head of a medical patient) is to be imaged, a smaller radio frequency coil is placed about that portion of the object. The use of localized coils produce a more homogeneous excitation field within the desired portion.

One common type of radio frequency coil is cylindrical with a conductive loop at each end and axial conductive elements connecting the loops at periodic intervals around their circumference, as described in U.S. Pat. Nos. 4,680,548 and 4,692,705. In one version, capacitors are placed in the end loops between adjacent axial conductive elements. The coil formed an endless loop transmission matrix that is excited by two signals in quadrature to produce a rotating electromagnetic excitation field within the coil. Heretofore the RF excitation coils were symmetrical so that the electrical signals traveled uniformly around the coil to establish a highly homogeneous excitation field. Because of its shape and appearance, this coil structure is sometimes referred as a "birdcage".

Birdcage coils have been used in full body coils and in localized coils for the head of a patient. For this latter application the coil was slipped over the head until its end rested against the patient's shoulders. As the optimum imaging region is in the central portion of the coil due to field inhomogeneity near the ends, the ability of this type of head coil to image the neck of the patient is limited.

SUMMARY OF THE INVENTION

A radio frequency NMR coil includes a first end loop formed by a plurality of conductive first segments connected in series with a node between adjacent segments. A second end loop is disposed spaced from the first end loop along a central axis, and has a plurality of conductive second segments connected in series by a plurality of nodes. A number of conductive elements of varying lengths are electrically connected between nodes of the first and second end loops. As the conductive elements vary in length, at least one of the end loops is non-planar.

One of a plurality of reactive devices is coupled between two sections of many of the first and second segments. Each such device has a reactance which varies depending upon where that device is located in first or second end loop. In the preferred embodiment of the radio frequency NMR coil, some of the segments of a non-planar end loop are formed by coaxial cables having a central conductor connected between two nodes of the first end loop. The segments with coaxial cables do not have capacitors; whereas all the remaining segments of that end loop have capacitors.

An object of the present invention is to provide a radio frequency coil for an NMR imaging system, which coil can be shaped to conform to the anatomy of an object being imaged. Even though such conformance dictates that the coil has an asymmetric shape, the coil is designed to produce a relatively homogeneous magnetic field within an imaging volume.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
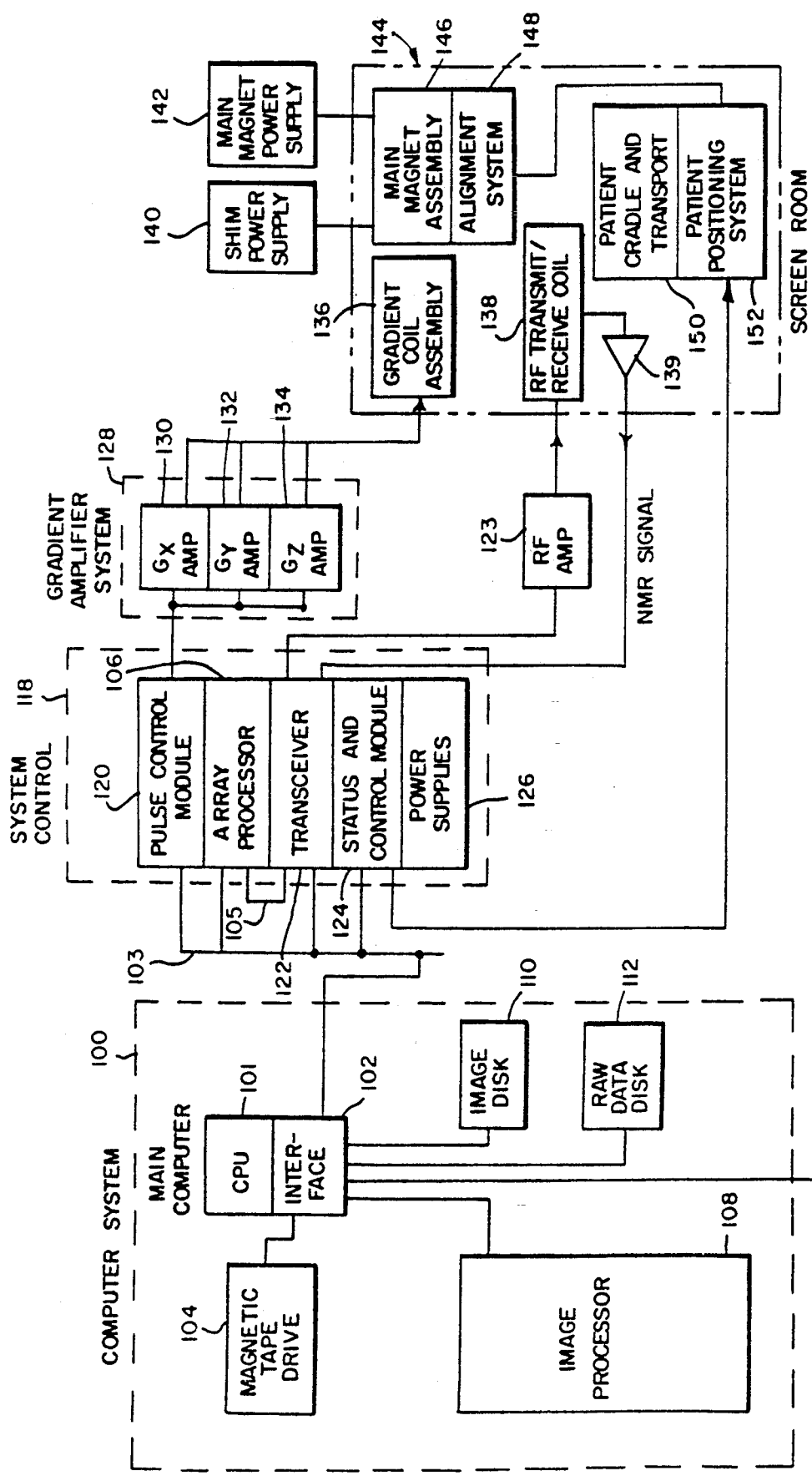
FIG. 1 is a block diagram of an NMR system which employs the present invention.

Referring initially to FIG. 1, there is shown in block diagram form the major components of an NMR system in which the present invention can be used and which is sold by the General Electric Company under the trademark "SIGNA". The overall operation of the system is under the control of a host computer system generally designated 100 which includes a main computer 101 (such as a Data General MV7800). Associated with the computer is an interface 102 through which a plurality of computer peripheral devices and other NMR system components are coupled. Among the computer peripheral devices is a magnetic tape drive 104 which under the direction of the main computer for archives patient data and images on tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console 116 also is used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 excites a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X, Y and Z axis directions of a Cartesian coordinate system.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146 to produce the excitation field $B_1$. The NMR signals radiated by the excited nuclei in the patient are sensed by the RF coil and amplified by a preamplifier 139. The NMR signals are amplified, demodulated, filtered, and digitized in the receiver section of the transceiver 122. For a detailed description of the transceiver 122, reference is made to U.S. Pat. Nos. 4,952,877 and 4,992,736 which are incorporated herein by reference. The processed NMR signals are transmitted to the array processor 106 for processing by means of a dedicated, unidirectional link 105.

Referring still to FIG. 1, the PCM 120 and SCM 124 are independent subsystems both of which communicate with main computer 101, peripheral system, such as patient positioning system 152, as well as to one another by means of serial communications link 103. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF shielded room generally designated 144.

Figure 2:
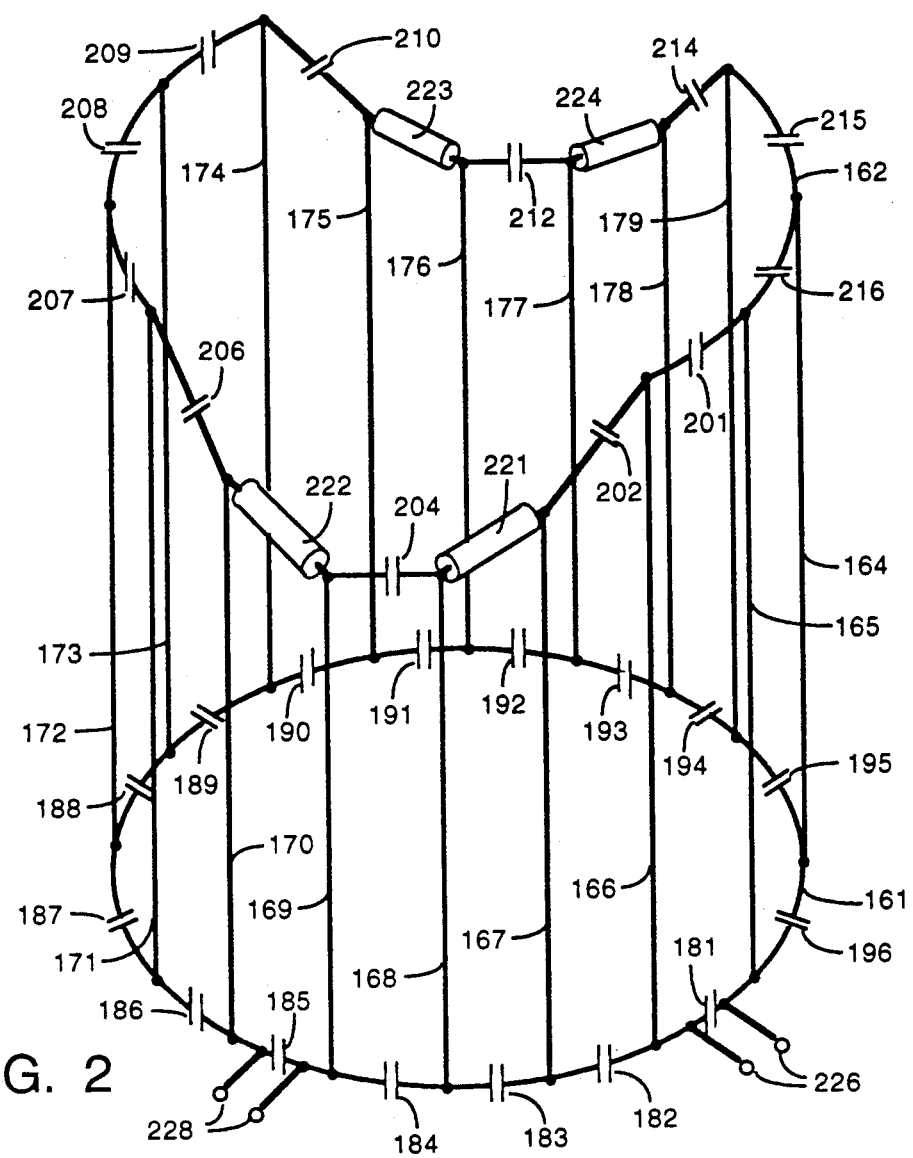
FIG. 2 is an schematic representation of a radio frequency coil for the NMR system.

The present invention relates to a novel RF coil 138 and FIG. 2 illustrates one embodiment of this coil design for use in imaging the head of a patient. The RF coil 138 has two electrically conductive end loops 161 and 162 spaced apart along a common central axis. These end loops may be circular, elliptical or another shape depending upon the desired geometry of the central opening of the coil in order to accommodate the part of the patient's body being imaged. Sixteen conductive axial elements 164–179 interconnect the two end loops 161 and 162 at nodes to form a coil structure that resembles a cage, hence the name "birdcage" by which coils of this generic design are commonly referred. The structure of the coil conductors defines a cylindrical imaging space within the coil. Although the exemplary field coil 138 has sixteen conductive axial elements, RF coils according to the present invention can be constructed with a greater or a lesser number of axial elements. The RF coil preferably is formed by applying conductors to a major surface of a tube, which has not been shown for ease of illustration.

On opposing sides of the coil selected axial elements 167-170 and 176-178 are shorter than the remaining elements creating a pair of notches in one end of the tubular coil. The notches are sized to accommodate the shoulders of a patient being imaged in order for that end of the coil 138 to extend over the upper portion of the patient's thorax. The extension of the coil over this anatomical portion improves imaging of the patient's neck and upper chest. Thus, while the first end loop is planar, the second end loop is non-planar forming a coil 138 that is asymmetrical. The deviation of the coil from symmetry in all directions adversely affects the homogeneity of the RF field produced inside the coil. As will be described, the present coil compensates for the inhomogeneity by placing elements of different capacitance in the end loops 161 and 162.

Segments of the first end loop 161 between adjacent axial elements 164-179 are broken approximately at their midpoint. A separate capacitor 181-196 bridges the break in each first loop segment. Each capacitor 181-196 can comprise a surface mount capacitor or can be formed by overlapping the sections of the loop segment with dielectric material therebetween. Segments of the second end loop 162 between adjacent axial elements 164-179 contain similar capacitors 201-216, with the exception of segments between axial elements 167-168, 169-170, 175-176 and 177-178.

Figure 3:
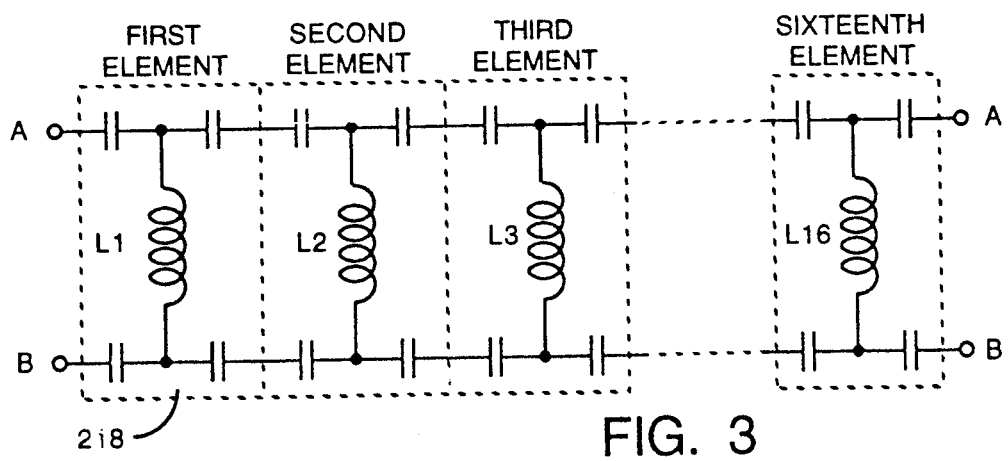
FIG. 3 represents a transmission matrix model of a coil according to the present invention.

The capacitance of each capacitor depends on the inductance of the adjacent axial elements. In determining the value of a specific capacitor, the RF coil 138 is analyzed as a sixteen element periodic structure depicted in FIG. 3 where one periodic section of the structure is designated 218. Note that each capacitor in FIG. 2 is represented by two capacitors, one in each adjacent periodic element of FIG. 3. In a previous birdcage coil where all of the axial elements were of equal length, the inductance L and capacitance C were substantially equal at all locations around the coil and were selected so that the RF coil resonated at the Larmor frequency in two orthogonal resonant modes.

The same circuit analysis employed for those previous symmetrical MRI radio frequency coils is used to define initial values for the capacitors 181-196 and 201-216 in coil 138, as if that coil is symmetrical, i.e. does not have notch in end loop 162. The capacitors, such as components 196 and 216, that are between two full length axial elements have this initial capacitance value. The value of a capacitor in a periodic element with a shorter axial element corresponds to the variance of inductance of the axial element from the calculated initial value. That is, the inductance L of the axial element in coil 138 is given by L m $L_i$, where $L_i$ is the initial value of inductance for a symmetrical coil; then the capacitance C of each capacitor in the periodic element is given by $C=C_i/m$ where $C_i$ is the initial value of capacitance for a symmetrical coil. It is apparent to those skilled in this art that the value for each capacitor 189-196 and 201-216 in the coil 138 shown in FIG. 2 is a combination of two capacitances in adjacent periodic elements in FIG. 3. Some of the capacitors can be adjustable to tune the coil 138 to resonate at the Lamor frequency in two orthogonal modes.

The RF coil 138 is excited by two radio frequency signals in quadrature from the RF amplifier 123. One signal is applied via leads 226 across the capacitor 181 in the first end loop 161. The other RF signal is applied via leads 228 and across the capacitor 185 spaced ninety degrees around the first end loop 161 from capacitor 181. The quadrature excitation signals can be applied at other locations on the first loop 161 or to the second loop 162. In other embodiments of the present invention these signals could be applied to axial elements.

The segments of the second loop 162 between axial elements 167-168, 169-170, 175-176 and 177-178 are formed by coaxial cables 221, 222, 223 and 224 respectively, and do not contain capacitors. Each coaxial cable 221-224 has a center conductor connected across ends of the two adjacent axial elements, for example the center conductor of cable 221 is connected in the second end loop 162 between axial elements 167 and 168. The outer coaxial shield of each cable 221-224 in unconnected. As these segments of the second end loop 162 do not contain a capacitor, the necessary capacitance to tune the coil is transferred to the corresponding segment of the first end loop 161. Thus capacitors 183, 185, 191 and 193 are one-half the value calculated as described above, since the parallel capacitor in the second end loop 162 has been removed.

As the magnitude of the current flowing through the end loops of a sixteen element birdcage coil is more than twice the current in the axial elements, the end loop current contributes significantly to the imaging field. An earlier version of the notched RF coil without the coaxial cables 221-224 produced a substantial degree of inhomogeneity in the imaging field within the coil due to the current flow in the coil notches.

The coaxial cables 221-224 restore some of the field homogeneity. Current flowing through the center conductor of these coaxial cables produces a current in the opposite direction in their shields even though the shields electrically float. In the case of the RF coil 138, the reverse current in the shields of the coaxial cables contributes to the imaging field and the current in the center conductor has minimal contribution. By reversing the direction of the imaging current in the segments of the second end loop 162 with the coaxial cables 221-224, a more homogeneous excitation field is produced.

The invention being claimed is:

1. A radio frequency NMR coil comprising:
   a first end loop comprising a first plurality of reactive devices coupled in a series with a separate node between adjacent reactive devices of the series;
   a second end loop comprising a second plurality of reactive devices coupled in a series with a separate node between adjacent ones of the second plurality of reactive devices, wherein each of said second plurality of reactive devices has a reactance which is dependent upon where that respective reactive device is located in said second end loop; and
   a plurality of conductive elements electrically connected between nodes of said first and second end loops, and at least some of said plurality of conductive elements having different lengths than other ones of said plurality of conductive elements.

2. The radio frequency NMR coil as recited in claim 1 wherein each reactive device in said first and second pluralities of reactive devices comprises a capacitor.

3. The radio frequency NMR coil as recited in claim 1 wherein each reactive device in said first and second pluralities has a capacitance determined by inductance of ones of said conductive elements that are connected at nodes to which the respective reactive device also connects.

4. The radio frequency NMR coil as recited in claim 1 wherein said second end loop further comprises a coaxial cable having a central conductor connected in series with the second plurality of reactive devices and between two nodes of said second end loop.

5. The radio frequency NMR coil as recited in claim 1 wherein said first end loop is planar and the second end loop is non-planar.

6. The radio frequency NMR coil as recited in claim 1 wherein said plurality of conductive elements is periodically spaced around said first and second end loops.

7. A radio frequency NMR coil comprising:
   a plurality of conductive elements arranged substantially parallel to one another to define a cylindrical space with some of said plurality of conductive elements having different lengths than other ones of said plurality of conductive elements, and each conductive element has a first end and a second end;
   a conductive first end loop connecting the first end of each of said conductive elements together and having a plurality of first segments each of which extending between two of said conductive elements, wherein each one of a plurality of the first segments includes a capacitor; and
   a conductive second end loop connecting the second ends of said conductive elements together and having a plurality of second segments each of which extending between two of said conductive elements, wherein at least one of the second segments being formed by a coaxial cable having a central conductor connected between a pair of conductive elements and other ones of the second segments, which do not have a coaxial cable, including a capacitor with a capacitance which is determined by where a given capacitor is located in the second end loop.

8. The radio frequency NMR coil as recited in claim 7 wherein said first end loop is planar, and said second end loop is non-planar.

9. A radio frequency NMR coil comprising a plurality of periodic elements connected in series to form an endless loop, each of said periodic elements including:
   a conductive element having two ends and a given inductance, wherein the inductance for at least some said periodic elements differs substantially from the inductance of other periodic elements;
   a first pair of capacitance elements each having a first terminal connected to one end of the conductive element and a second terminal connected to a capacitance element in another periodic element, and
   a second pair of capacitance elements each having a first terminal connected to another end of the conductive element and a second terminal connected to a capacitance element in another periodic element;
   wherein the first and second pairs of capacitance elements have capacitances determined by the inductance of the conductive element.

* * * * *